United States Patent [19]
Harrison et al.

[11] Patent Number: 5,747,936
[45] Date of Patent: May 5, 1998

[54] ION IMPLANTATION APPARATUS WITH IMPROVED POST MASS SELECTION DECELERATION

[75] Inventors: Bernard Harrison, Copthorne; Frederick G. Plumb, Horsham, both of England

[73] Assignee: Applied Materials, Inc., Santa Clara, Calif.

[21] Appl. No.: 758,134

[22] Filed: Nov. 25, 1996

[30] Foreign Application Priority Data

Nov. 23, 1995 [GB] United Kingdom ............... 9523982

[51] Int. Cl.⁶ ..................................................... G21K 5/04
[52] U.S. Cl. ............... 315/111.81; 315/506; 250/492.21
[58] Field of Search ........................... 315/111.81, 506; 250/398, 492.21

[56] References Cited

U.S. PATENT DOCUMENTS

| | | | |
|---|---|---|---|
| 4,179,312 | 12/1979 | Keller et al. | 117/9 |
| 4,595,837 | 6/1986 | Wu et al. | 250/492.21 |
| 4,743,806 | 5/1988 | Gyulai et al. | 315/111.81 |
| 4,766,320 | 8/1988 | Naitoh et al. | 250/398 X |
| 4,782,304 | 11/1988 | Aitken | 315/506 |

FOREIGN PATENT DOCUMENTS 5-343028  12/1993  Japan ..................... 315/111.81

OTHER PUBLICATIONS

"Wafer chargeup study on the PR-80 high current ion plantation machine", by Nagai et al., *Nuclear Instruments & Methods in Physics Research*, vol. B37/38 No. 2, Feb. 2, 1989, pp. 572-575.

*Primary Examiner*—Robert Pascal
*Assistant Examiner*—Justin P. Bettendorf

[57] ABSTRACT

A controlled deceleration potential is provided in an ion implanter between the target and the flight tube through the mass selector, by means of a variable resistance comprising a series of HEXFETs. The series of HEXFETs conduct current absorbed by the substrate back to the flight tube so that a desired decelertion potential can be formed.

9 Claims, 4 Drawing Sheets

ION IMPLANTATION APPARATUS WITH IMPROVED POST MASS SELECTION DECELERATION

FIELD OF THE INVENTION

The present invention is concerned with ion implantation apparatus, particularly as used in the manufacture of semiconductor devices.

BACKGROUND OF THE INVENTION

In manufacturing semiconductor devices, it is necessary to modify the semiconductor substrate material (typically silicon) by diffusing or implanting therein atoms or molecules of selected dopants to produce regions in the semiconductor substrate of selected varying conductivity and having majority charge carriers of different polarities. Typical dopant materials are boron, phosphorous, arsenic and antimony.

Doping the semiconductor substrate using ion implantation has become an increasingly important method in the manufacture of semiconductor devices since this allows smaller device features to be made, resulting in reduced size overall for the semiconductor devices and increased operational speed.

A typical ion implantation apparatus is disclosed in U.S. Pat. No. 4,754,200.

In general, an ion implantation apparatus includes an ion source in which a plasma produces positive ions of the desired dopant atom or molecule. The required ions are extracted from the source and accelerated to a predetermined energy at which they are passed through a mass selection arrangement. The mass selection arrangement typically comprises a magnetic field in which the radius of curvature of the flight path of the ions from the source will be dependent upon the mass/charge ratio of the individual ions. A mass selection slit after the magnetic field region allows ions of a selected mass/charge ratio to pass through to the target substrate.

Prior to implantation, the semiconductor substrate, i.e. typically a silicon wafer, is commonly prepared with a required pattern of photo resist, so that ions will be implanted only in selected regions of the wafer as required.

The depth to which ions are implanted in the silicon wafer is dependent upon the energy of the ions as they impinge upon the wafer surface. With the increasing demand for smaller and faster semiconductor devices, there is an increasing need for the production of very shallow structures in the wafer requiring the use of ions of relatively low energy at the point of implantation.

On the other hand, there is a minimum desirable energy for the extraction of ions from the ion source. Below this minimum extraction energy, the ion current from the source reduces as a function of the reduced energy of extraction. To maintain desirable high levels of beam current impacting on the substrate (to maximise processing speeds), the extraction energy should therefore not be below the minimum value to achieve efficient extraction. It is convenient also to maintain the ions at the extraction energy through the mass selection section of the implantation apparatus to minimise space charge dispersion effects. Therefore, to achieve an implant energy (the energy at which the mass selected ions impact the substrate) which is below the extraction energy, there is a requirement to decelerate the ions after mass selection.

In the prior art, post mass selection deceleration has been accomplished with the use of an additional variable voltage supply connected between a holder for the semiconductor wafer to be implanted and a flight tube providing a uniform energy regime in the mass selection part of the implantation apparatus. The voltage supply is provided by a regulated power supply feeding current through a resistance connected across the power supply. The resistance is provided to ensure sufficient forward current is drawn through the power supply so that the power supply can maintain proper voltage regulation.

Although such an arrangement for post mass selection deceleration operates quite satisfactorily, the provision of the additional regulated power supply is an expensive solution, it being understood that the power supply may have to supply a regulated voltage over a range of say 0.5 kV to 15 kV. Furthermore, difficulties can still be experienced if the forward current through the deceleration power supply falls too low.

In the following description and in the claims appended hereto, references are made to the "flight tube" of an ion implantation apparatus. In accordance with a known practice the term "flight tube" is used throughout this specification and the claims to refer to the metal work of the mass analysis section of the apparatus which is normally all at a common potential. The potential of the flight tube, relative to the target substrate (which is normally at or close to ground potential) is positive for post mass selection acceleration of the ion beam (assumed positive ions), and is negative for post mass selection deceleration.

A schematic of the current flows in a prior art arrangement for post mass selection deceleration is illustrated in FIG. 1. In FIG. 1, the top of the drawing represents the ion source and the bottom of the drawing represents the semiconductor wafer to be implanted, or the beamstop of the apparatus, used to absorb the ion beam in the absence of a semiconductor wafer. A regulated power supply provides the required acceleration potential at 10 between the ion source and the flight tube of the mass selection arrangement of the apparatus. The flight tube is represented by the central horizontal line of the diagram. Current from the acceleration power supply effectively flows from the ion source as a beam of positive ions accelerated from the source to the energy corresponding to the acceleration supply voltage. This beam current leaving the ion source may be called the acceleration beam current ($I_{accel}$) from the current source 11 in the diagram.

Although this acceleration beam current is generated by a voltage applied between the ion source and the flight tube, not all the beam current returns to the flight tube. The mass selected ions at the required mass/charge value exit the flight tube and continue on to the semiconductor wafer or beamstop, indicated at 12 in the diagram. Generally, the mass selected beam impinging upon the semiconductor wafer or beamstop will result in a positive net current flowing into the wafer or beamstop representing the net beam current ($I_{beam}$)<($I_{accel}$).

In order to reduce the energy of the selected ions emerging from the flight tube, the deceleration power supply, illustrated at 13 in the diagram, is connected to apply a reverse potential between the flight tube and the semiconductor wafer holder or beamstop. Then the selected ions impinge upon the wafer or beamstop with an energy corresponding to the difference between the acceleration supply voltage 10 and the deceleration voltage 13.

In order for the deceleration supply 13 to maintain voltage regulation, it is important to ensure that a forward current flows through the supply and this is achieved by connecting a deceleration supply load resistance 14 between the terminals of the power supply 13. The current flowing through the deceleration load resistance 14 comprises the forward current through the deceleration power supply 13 ($I_{decel}$) plus the net beam current $I_{beam}$ absorbed by the semiconductor wafer or beamstop 12.

If the residual beam current $I_{beam}$ is too great, the forward current through the deceleration power supply 13 $I_{decel}$ would be too low for the power supply to maintain proper voltage regulation.

The present invention provides a system for generating the required deceleration potential difference between the flight tube and substrate holder of an implantation apparatus which avoids these problems and dispenses with the need for the regulated deceleration power supply.

SUMMARY OF THE INVENTION

According to the present invention an ion implantation apparatus comprises a holder for a substrate to be implanted, a source of ions for implanting in the substrate, a flight tube through which ions from the source fly towards the substrate holder, an acceleration supply connected to provide an acceleration bias between the source and the flight tube to accelerate ions to a predetermined energy in excess of the desired implantation energy, a controllable current path connected to conduct net beam current absorbed by the substrate or the substrate holder from the substrate holder to the flight tube, said current path being controllable to produce a controlled potential drop over said current path while conducting only the net beam current, thereby producing a deceleration bias between the substrate holder and the flight tube, and a controller operative to control said current path to maintain said deceleration bias to decelerate ions to the desired implantation energy.

It will immediately be apparent that this construction dispenses with the usual deceleration power supply and instead uses the control of a current path conducting the net beam current absorbed by the substrate or substrate holder to maintain the desired deceleration bias.

In a typical implantation apparatus the substrate holder may comprise a rotatable spider adapted to hold a semiconductor wafer on each of its arms. During implantation, the spider is rotated and translated so that the beam scans the wafers fully and evenly. A beam stop is located behind the spider to absorb the ion beam or any part of it passing the spider during the scanning process. The beam stop and spider may be electrically connected together and the net beam current conducted by the variable resistance mentioned above may then comprise the beam current absorbed by any of the wafers, by the spider and by the beam stop. References herein to the substrate holder should be construed in the context of this specification to include not only those parts of the apparatus directly responsible for supporting the substrate during operation, but also other parts on which beam ions impact at the implantation energy, so that there is a net current flowing through the controllable current path continuously during an implant operation producing a potential drop sufficient to provide said deceleration bias.

It will be understood by those experienced in this field that the total current, herein called the net beam current, flowing through said controllable current path may additionally include contributions from other sources such as loads required by potential sensors.

In the simplest form, the controllable current path would take the form of a variable resistance, but any controllable path is contemplated containing active or passive components which can be adjusted to provide a required potential drop while conducting only the beam current.

Preferably, said controllable current path comprises a number n (n>1) of field effect transistors connected in series. Conveniently, said controllable current path comprises a plurality of series connected bias resistors connected in parallel with said series connected field effect transistors to form a potential divider having n−1 tap points between adjacent pairs of resistors, a field effect transistor at one end of said series having a gate terminal forming a control terminal for the controllable current path, and the remaining n−1 field effect transistors of the series having gate terminals connected to respective said tap points of the potential divider, whereby the total voltage drop across the series of field effect transistors due to the net beam current conducted thereby is shared between the field effect transistors.

Preferably, the controller includes a comparator comparing the deceleration bias produced by the controllable current path with a predetermined bias value selected to decelerate ions to the desired implantation energy and is responsive to said comparison to control said current path to maintain said deceleration bias close to said predetermined bias value. The controller may comprises a potential divider connected between the substrate holder and the flight tube and having a tap providing a signal representing said deceleration bias and a high gain differential amplifier having a first input connected to receive a signal representing said predetermined bias value and a second input connected to receive said deceleration bias signal, the output of the amplifier being connected to supply a control signal for the controllable current path.

Instead, the controller may include a sensor providing a signal representing the implantation energy of the ion beam impinging on the substrate, and a comparator comparing said sensed implantation energy signal with a reference signal representing the desired implantation energy, the controller being operative to control said current path to maintain said sensed implantation energy close to said desired implantation energy.

Preferably, the apparatus includes a suppression electrode located around the beam path before the substrate holder and a suppression supply arranged to bias said suppression electrode to suppress charged particles in the beam having opposite polarity to the desired ions from being accelerated out of the beam by the deceleration bias. This suppression electrode and bias supply also reduces the current of said opposite polarity particles (typically electrons) in the beam reaching the substrate and holder, so that there remains sufficient net beam current to be conducted by the controllable current path to the flight tube of the apparatus to generate the deceleration bias.

The present invention also contemplates a method of implanting ions in a substrate at a desired implant energy comprising accelerating ions from a source to a transport energy which is greater than said desired implant energy, mass selecting at said transport energy to produce a beam of the ions desired for implanting, and then decelerating the beam of mass selected ions to impact the substrate at said desired implant energy, wherein the substrate absorbs a net beam current from desired ions impacting thereon, and the method includes conducting said net beam current along a controllable current path to generate a potential drop over said current path providing a deceleration bias for decelerating said beam, sensing said deceleration bias, comparing the sensed deceleration bias with a predetermined bias value selected to produce the desired implant energy in the decelerated ions, and controlling the current path so that the sensed deceleration bias corresponds to the predetermined bias value. Preferably, charged particles of opposite polarity to the desired ions are suppressed from being accelerated out of the beam by the deceleration bias.

Examples of the present invention will now be described with reference to the accompanying drawings.

DETAILED DESCRIPTION OF THE PREFERRED EMBODIMENTS

Figure 1:
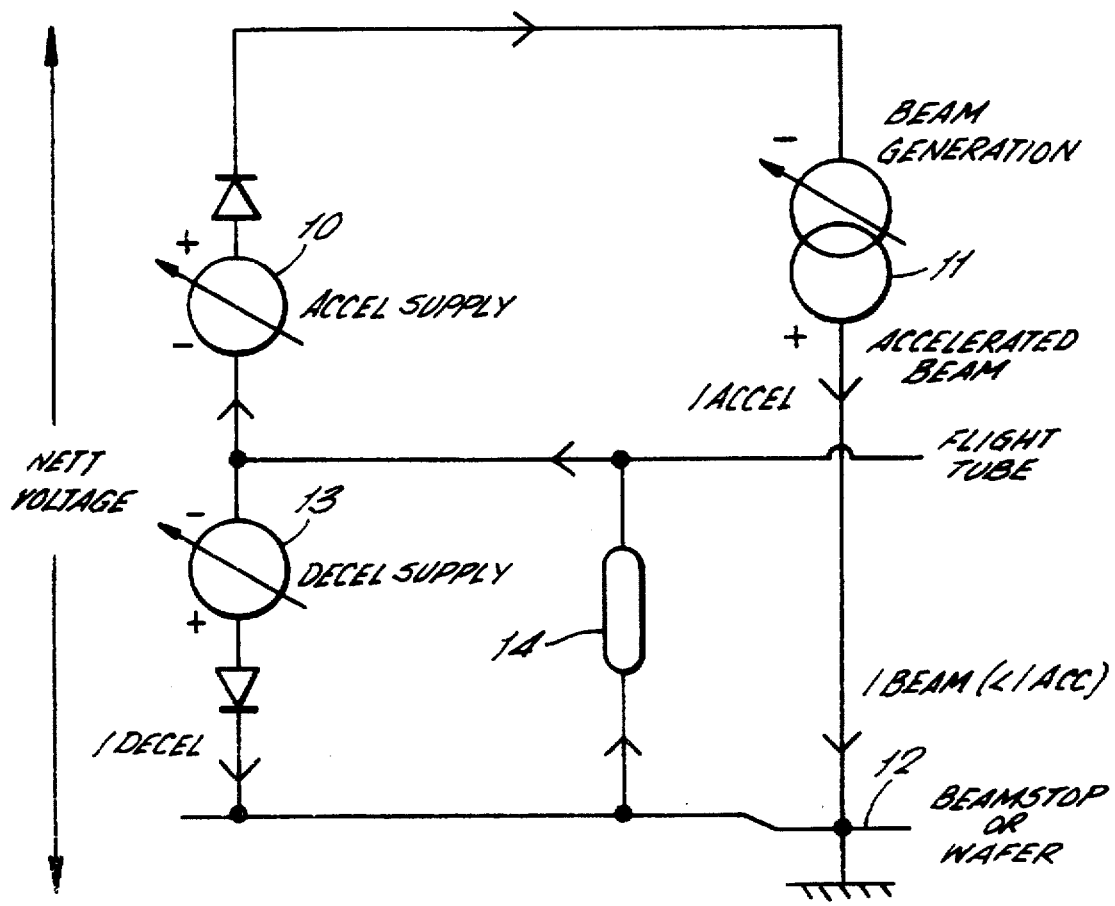
FIG. 1 is a schematic diagram illustrating the current flows in a prior art implantation apparatus.
Figure 2:
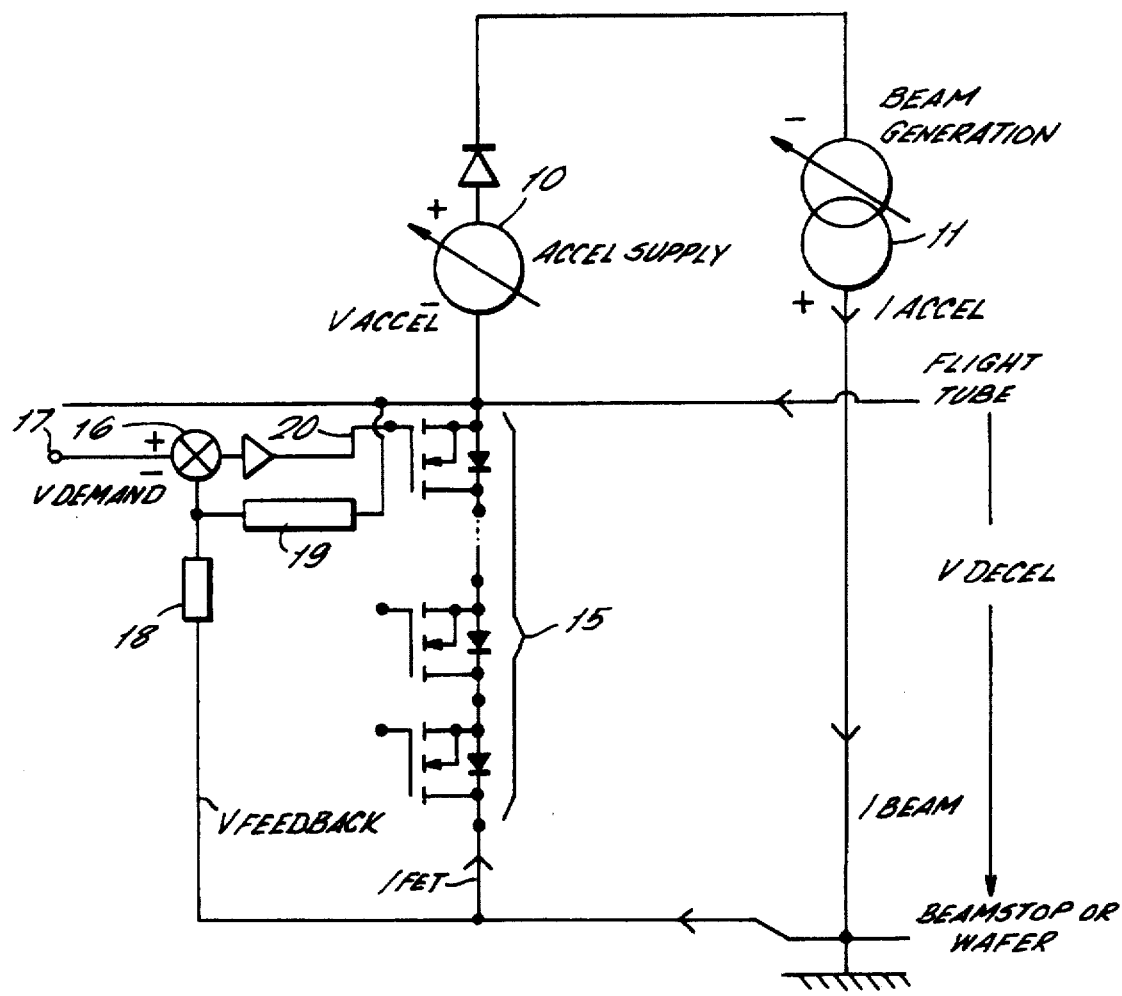
FIG. 2 is a schematic diagram illustrating the current flows in an ion implantation apparatus embodying the present invention.

The diagram of FIG. 2 includes features which are common to the prior art diagram of FIG. 1 described previously. Thus, an acceleration power supply 10 applies a desired acceleration bias between the ion source and the flight tube of the apparatus. The resultant beam extracted from the ion source has a total beam current $I_{accel}$. The selected ions leaving the flight tube of the apparatus and travelling on towards the semiconductor wafer 12 form a beam having a net beam current $I_{beam}$ as it is absorbed by the wafer.

Instead of the deceleration power supply of FIG. 1, in the arrangement embodying the present invention shown in FIG. 2, a controllable current path 15 is connected between the flight tube and the holder for the semiconductor wafer. The current absorbed by the wafer $I_{beam}$ is thus conducted through the current path 15 back to the flight tube, producing a controllable voltage drop over the current path. A controller for the current path 15 comprises a comparator 16, comparing a reference value of deceleration voltage ($V_{demand}$) applied to one terminal of the comparator on a line 17, with the actual value of the deceleration bias voltage applied to the other terminal of the comparator 16 from a potential divider 18, 19 connected between the flight tube and the wafer holder. Any difference between the voltage signals applied to the comparator 16 is amplified and used to adjust a control signal on a line 20 which controls the current path 15.

The current path 15 operates as a variable resistance which is automatically adjusted to a value which produces the required deceleration bias potential across the resistance, when conducting the net beam current from the wafer to the flight tube of the implantation apparatus. However, in practical embodiments the current path 15 may not be resistive in the sense of obeying Ohm's Law, so long as it can be controlled to provide a desired potential drop while conducting the beam current. References in the following to "variable resistance" should be interpreted with this in mind.

Figure 3:
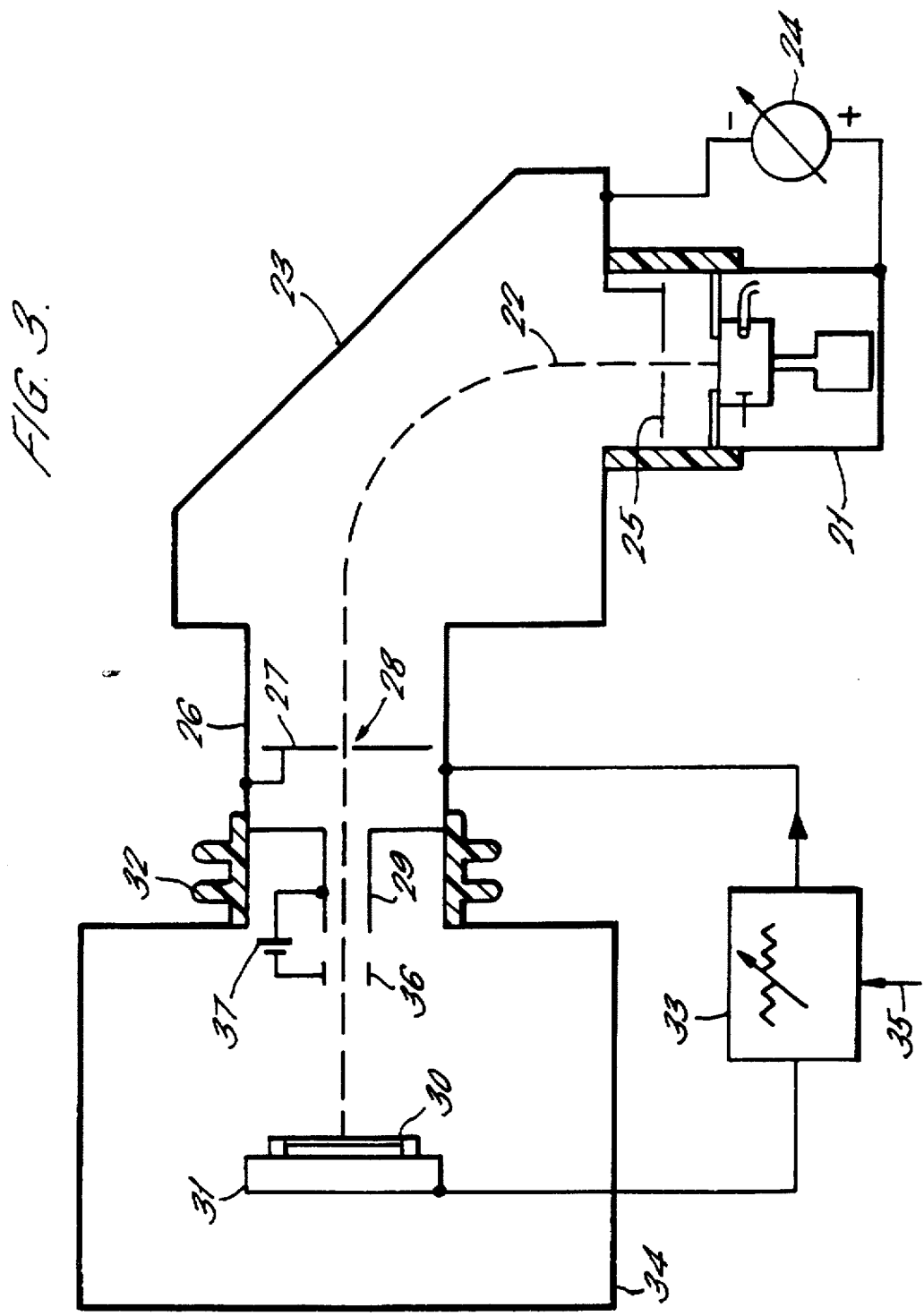
FIG. 3 is a simplified schematic cross-sectional view of an ion implantation apparatus embodying the invention.

FIG. 3, illustrates schematically how the variable resistance is connected to an implanter. The illustrated implanter has an ion source 21 from which required ions (normally positive ions) are extracted in a beam 22 and supplied into an analysing magnet 23. In order to extract the ions from this source and accelerate them to the energy desired for proper transportation and analysing, the ion source 21 is maintained at an acceleration bias relative to the structure of the analysing magnet 23 by means of an acceleration bias power supply 24.

In practice, in accordance with known procedures in this technical field, an extraction electrode 25 may be provided to extract the ions from the source. The electrode 25 is connected to the structure of the analysing magnet.

The ion source 21 may take the form of any known ion source used in this technology, including the well known Freeman or Bernas ion source structures.

Within the analysing magnet 23, the beam 22 of ions passes through a magnetic field causing the ions to bend as illustrated to emerge into a mass selection region 26. The radius of curvature of the path of the ions in the analysing magnet 23 is, as known to those skilled in this art, dependent upon the mass/charge ratio of the ions in the beam. In the mass selection unit 26, a desired mass/charge ratio of ions is selected by means of a mass selection electrode 27 defining a slit 28, though which only ions of the desired mass/charge ratio will pass. The structure and electrodes within the mass selection unit 26 are at the same potential as the analysing magnet, as determined relative to the ion source 21 by the acceleration power supply unit 24.

The mass selected ions emerge from the mass selection unit 26 along a tube 29 to strike a semiconductor wafer 30 retained in a holder 31. Tube 29 is electrically connected to and forms part of the flight tube of the mass selection region 26 and magnet 23.

To maximise beam current, the ions are extracted from the source typically at a minimum extraction energy between 2 keV and 15 keV, e.g. about 10 keV. This energy is maintained throughout the flight tube of the mass selection region 26 until the ions emerge from the tube 29 towards the substrate 30 to be implanted. However, as explained previously, it may be desirable for the energy at which the ions impact the substrate 30 to be considerably lower than this, even as low as several hundred electron-volts. Accordingly, to decelerate the beam of mass selected ions emerging from the tube 29, a reverse bias voltage must be applied between the substrate 30 and the flight tube (which is at the potential relative to the ion source set by the acceleration voltage supply unit 24).

The housing accommodating the substrate holder 31 is mounted relative to the flight tube and mass selection unit 26 by insulating stand-offs 32. A variable resistance 33 is connected between the holder 31 of the substrate 30 (and the target housing 34), and the structure of the tube 29 (and housing for the mass selection unit 26 together with the structure of the analysing magnet 23, which are together referred to herein as the flight tube for convenience). The value of the resistance 33 is controlled so that the potential difference between the holder 31 and the flight tube, which represents the deceleration bias, is substantially equal to a reference value supplied on a line 35. In practice, the substrate and holder are normally connected to ground potential so the variable resistance 33 produces a negative potential with respect to ground at the flight tube. This potential is the deceleration bias voltage applied to the ion beam.

A suppression electrode 36 is located around the beam leaving the tube 29 and is biased at a negative potential relative to the flight tube. The suppression electrode 36 provides a potential barrier repelling electrons travelling in the beam and preventing them from being accelerated by the deceleration bias out of the beam upstream of the electrode 36. The suppression electrode also reduces the electronic current in the beam impinging on the substrate 30, ensuring there is adequate net beam current from positive ions to generate the deceleration bias across the resistance 33.

Figure 4:
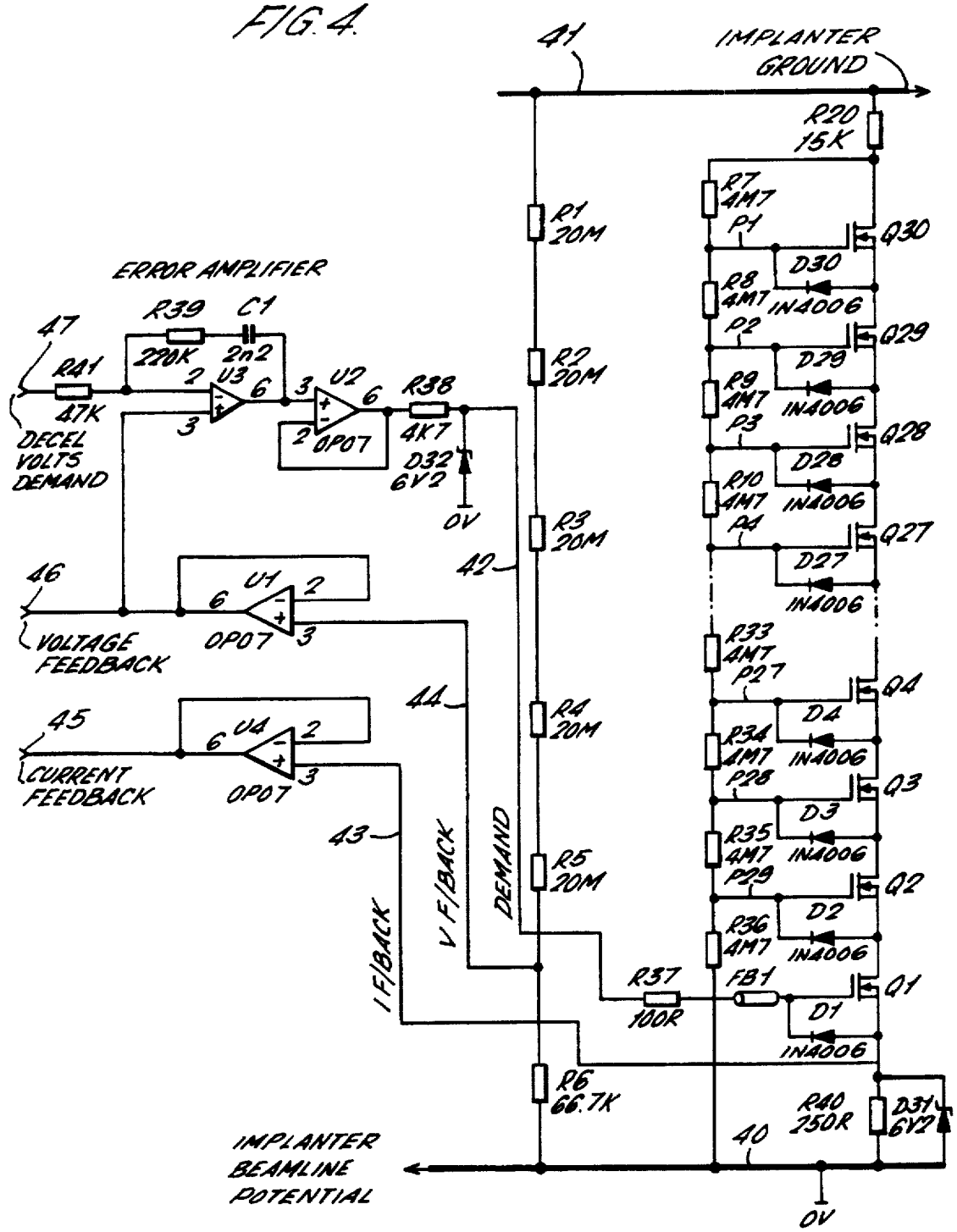
FIG. 4 is a circuit diagram illustrating an embodiment of variable resistance for use in the embodiments of FIGS. 2 and 3, together with the required control electronics.

FIG. 4 illustrates in greater detail the form of the variable resistor 33 together with a controller therefore. The resistance is formed of a number of similar field effect transistors Q1 to Q30 connected in series between a lower line 40 representing the flight tube of the implantation apparatus, and an upper line 41, representing the holder for the semiconductor wafer. Thus, the lower line may be at a potential customarily referred to as the Implanter Beamline Potential and the upper line may be connected to what is customarily referred to as Implanter Ground. The Implanter Beamline Potential will be taken as zero volts for the purposes of the electronic circuitry illustrated in FIG. 4 for controlling the value of the variable resistance formed by the field effect transistors Q1 to Q30. In practice, Implanter Ground will normally be connected to external ground so that the implanter beamline will be at a negative potential determined by the deceleration bias generated across the variable resistance.

In FIG. 4, the FETs are identical high voltage units designed to operate with high values of drain-source voltage before breakdown. Transistors of this kind are available which can have a drain-source voltage in excess of 1 kV. In one example, the transistor used is that known by the designation BUK156-1000B from PHILIPS. As shown, all thirty transistors are connected with the source of one unit connected to the drain of the next in line. A set of thirty series connected resistors R7 to R36 are also connected in parallel with the series connected FETs. The resistors R7 to R36 each have the same value, thereby providing 29 tapping points P1 to P29 between adjacent pairs of the resistors R7 to R36. 29 of the FETs, Q30 to Q2, have their gate terminals connected respectively to the tapping points P1 to P29 of the potential divider formed by the resistors R7 to R36. The FET Q1 at the lower end of the series of transistors has its gate terminal connected to receive a control signal on a line 42 from control electronics which will be described below.

The resistors R7 to R36 each have a relatively high value to minimise current flow down the potential divider formed by these resistors, but sufficient to provide current to charge the gates of each of the field effect transistors connected to the respective tapping points. It can be seen, that the resistors R7 to R36 effectively ensure that the source terminals of the respective transistors Q30 to Q2 are at voltages corresponding to the voltages at the tapping points P1 to P29, (less the bias voltage $V_{GS}$ on each transistor). As a result, all the resistors Q1 to Q30 are controlled so as to share the total potential difference between lines 40 and 41 substantially equally. Only the lowermost transistor Q1 is directly controlled by the control electronics. However, it will be seen that a change in the bias voltage ($V_{GS}$) applied to transistor Q1, e.g. to reduce the effective drain-source resistance of transistor Q1, tends to reduce the voltage on the source of the neighbouring transistor Q2, producing a corresponding change in its bias voltage, and so forth along the whole chain of transistors.

Although the chain of transistors has been described above as being connected to the Implanter Ground line 41, this connection is in fact made via a low value resistance R20, to protect the transistors Q1 to Q30 when turned hard ON for minimum deceleration bias. Resistance R20 additionally provides a current limit in the event of an external air arc from the ion source to ground. Also, the lowermost of the transistors is connected to the Implanter Beamline Potential 40 via a low value resistor R40. This resistor essentially senses the current flowing through the transistor series, providing a voltage signal on a line 43 corresponding to this current. A Zener diode D31 connected in parallel with the resistor R40 protects the resistor from current loads in excess of about 25 milliamps.

The actual deceleration bias between Implanter Ground 41 and beamline potential 40 at anytime is sensed by a potential divider comprising a chain of resistors R1 to R6. A tap between resistors R5 and R6 provides a relatively low voltage signal, having a maximum 10 volts in this particular implementation, on line 44 corresponding to the deceleration potential.

The signals on lines 43 and 44 are buffered in buffer circuits, U4 and U1 and supplied to terminals 45 and 46 as current and voltage feedback signals respectively for use elsewhere in the implanter instrument. However, the buffered deceleration voltage feedback signal is also supplied to the non-inverting input of a high gain operational amplifier U3, in which is it compared with a reference signal indicating the required deceleration bias, supplied to a terminal 47.

The operational amplifier U3 has a capacitor C1 in series with a resistor R39 connected between its output terminal and the inverting input terminal. A resistor R41 is connected in series with the reference signal supplied to the inverting terminal of the operational amplifier from the terminal 47. The signal from the output of the operational amplifier U3 is buffered in a further operational amplifier U2 and then supplied via a resistor R38 and a further resistor R37 to the control input of the variable resistance, represented by the gate terminal of FET Q1.

The amplifier U3 with the illustrated feedback connection represented by capacitor C1 and resistor R39 together with the input resistor R41 has a very high forward gain at low frequencies, so that the signal on the line 42 applied to the gate of the field effect transistor Q1 is controlled so that the variable resistance sets the deceleration bias between lines 40 and 41 precisely so that the signal on line 44 is kept very close if not equal to the desired deceleration bias value represented by the reference signal on terminal 47. The feed back provided by resistor R39 and capacitor C1 stabilises the voltage control system embodied here in a manner which will be well known to those familiar with control systems.

A zener diode D32 connected across the output of the buffer U2 restricts the swing of the control signal on line 42 relative to the beamline potential on line 40.

Although the example of the invention described above has been described with reference to a series connection of high voltage field effect transistors operating in variable resistance mode, similar control of a deceleration bias resistance could be achieved in other ways. For example, a mechanical variable resistance could be used driven by a suitably controlled servo mechanism.

Other examples of current controlling devices that could be used for the variable resistance providing the return path for net beam current are:
a) A series chain of insulated gate bipolar transistors (IGBTs).
b) A series chain of bipolar transistors.
c) A grid controlled thermionic value such as a triode, tetrode, pentode etc.

The important parameters for a return beam current controlling device are:
i) A voltage capability of 1 kV each is desirable for chains of IGBT, FET or Bipolar devices. A single thermionic device may have a voltage capability in excess of 15 kV.
ii) The control current for the device should be sufficiently low to allow for control of sub-milliamp beams. The FET assembly described in this application operates down to 110 μA in tests. IGBTs and especially bipolar devices have larger control currents.

In the above description, the variable resistance (or current path) is controlled to provide a desired deceleration bias value by monitoring the potential drop across the resistance. The variable resistance may alternatively be controlled directly to provide a desired implantation energy. Then a signal representing the actual implantation energy is compared with a desired value and the variable resistance controlled accordingly. The actual implantation energy signal would be a voltage proportional to the potential of the ion source (21 in FIG. 3) relative to the substrate and would be positive. An increase in the actual implantation energy signal would be compensated for by a corresponding increase in the deceleration bias produced across the variable resistance.

We claim:

1. An ion implantation apparatus comprising a holder for a substrate to be implanted, a source of ions for implanting in the substrate, a flight tube through which ions from the source fly towards the substrate holder, an acceleration supply connected to provide an acceleration bias between the source and the flight tube to accelerate ions to a predetermined energy in excess of the desired implantation energy, a controllable current path connected to conduct net beam current absorbed by the substrate or the substrate holder from the substrate holder to the flight tube, said current path being controllable to produce a controlled potential drop over said current path while conducting only the net beam current, thereby providing a deceleration bias between the substrate holder and the flight tube, and a controller operative to control said current path to maintain said deceleration bias to decelerate ions to the desired implantation energy.

2. An apparatus as claimed in claim 1, wherein said controllable current path comprises a number n(n>1) of field effect transistors connected in series.

3. An apparatus as claimed in claim 2, wherein said controllable current path comprises a plurality of series connected bias resistors connected in parallel with said series connected field effect transistors to form a potential divider having n−1 tap points between adjacent pairs of resistors, the field effect transistor at one end of said series having a gate terminal forming a control terminal for the controllable current path, and the remaining n−1 field effect transistors of the series having gate terminals connected to respective said tap points of the potential divider, whereby the total voltage drop across said series of field effect transistors due to the net beam current conducted thereby is shared between the field effect transistors.

4. An apparatus as claimed in any preceding claim, wherein the controller includes a comparator comparing the deceleration bias produced by the controllable current path with a predetermined bias value selected to decelerate ions to the desired implantation energy and is responsive to said comparison to control said current path to maintain said deceleration bias close to said predetermined bias value.

5. An apparatus as claimed in claim 4, wherein the controller comprises a potential divider connected between the substrate holder and the flight tube and having a tap providing a signal representing said deceleration bias, and a high gain differential amplifier having a first input connected to receive a signal representing said predetermined bias value and a second input connected to receive said deceleration bias signal, the output of the amplifier being connected to supply a control signal for the controllable current path.

6. An apparatus as claimed in claim 1 including a suppression electrode located around the beam path before the substrate holder, and a suppression supply arranged to bias said suppression electrode to suppress charged particles in the beam having opposite polarity to the desired ions from being accelerated out of the beam by the deceleration bias.

7. A method of implanting ions in a substrate at a desired implant energy comprising accelerating ions from a source to a transport energy which is greater than said desired implant energy, mass selecting at said transport energy to produce a beam of the ions desired for implanting and then decelerating the beam of mass selected ions to impact the substrate at said desired implant energy, wherein the substrate absorbs a net beam current from desired ions impacting thereon, and the method includes conducting said net beam current along a controllable current path to generate a potential drop over said current path providing a deceleration bias for decelerating said beam, sensing said deceleration bias, comparing the sensed deceleration bias with a predetermined bias value selected to produce the desired implant energy in the decelerated ions, and controlling the current path so that the sensed deceleration bias corresponds to the predetermined bias value.

8. A method of implanting ions in a substrate at a desired implant energy comprising accelerating ions from a source to a transport energy which is greater than said desired implant energy, mass selecting at said transport energy to produce a beam of the ions desired for implanting and then decelerating the beam of mass selected ions to impact the substrate at said desired implant energy, wherein the substrate absorbs a net beam current from desired ions impacting thereon, and the method includes conducting said net beam current along a controllable current path to generate a potential drop over said current path providing a deceleration bias for decelerating said beam, sensing the implant energy of ions impacting on the substrate, comparing the sensed implant energy with the desired implant energy, and controlling the current path so that the sensed implant energy corresponds to the desired implant energy.

9. A method as claimed in claim 7 or claim 8, wherein charged particles of opposite polarity to the desired ions are rejected from the beam prior to impact on the substrate.

* * * * *